(12) United States Patent
Chen et al.

(10) Patent No.: US 7,076,416 B2
(45) Date of Patent: Jul. 11, 2006

(54) METHOD AND APPARATUS FOR EVALUATING LOGIC STATES OF DESIGN NODES FOR CYCLE-BASED SIMULATION

(75) Inventors: Liang T. Chen, Saratoga, CA (US); William kwei-cheung Lam, Newark, CA (US); Thomas M. McWilliams, Menlo Park, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 883 days.

(21) Appl. No.: 10/105,754

(22) Filed: Mar. 25, 2002

(65) Prior Publication Data

US 2003/0037305 A1   Feb. 20, 2003

Related U.S. Application Data

(60) Provisional application No. 60/313,762, filed on Aug. 20, 2001.

(51) Int. Cl.
*G06F 17/50* (2006.01)

(52) U.S. Cl. .............................. 703/15; 703/13; 703/14; 703/16; 703/2; 716/3; 716/4; 716/7; 717/141

(58) Field of Classification Search ............ 703/13–16; 717/141, 160; 716/4, 6, 18
See application file for complete search history.

(56) References Cited

U.S. PATENT DOCUMENTS

| | | | | |
|---|---|---|---|---|
| 5,691,911 A | * | 11/1997 | Gregory et al. ............... 716/18 |
| 5,748,488 A | * | 5/1998 | Gregory et al. ............... 716/18 |
| 5,784,593 A | * | 7/1998 | Tseng et al. ................... 703/15 |
| 5,787,010 A | * | 7/1998 | Schaefer et al. ................ 716/7 |
| 5,809,283 A | * | 9/1998 | Vaidyanathan et al. ........ 703/16 |
| 5,937,183 A | * | 8/1999 | Ashar et al. ................... 703/14 |
| 5,956,498 A | * | 9/1999 | Mangelsdorf ................... 716/2 |
| 6,012,836 A | * | 1/2000 | Mangelsdorf ................... 703/6 |
| 6,334,205 B1 | * | 12/2001 | Iyer et al. ...................... 716/7 |
| 6,389,374 B1 | * | 5/2002 | Jain et al. ...................... 703/2 |
| 6,453,437 B1 | * | 9/2002 | Kapur et al. ................ 714/741 |
| 6,480,816 B1 | * | 11/2002 | Dhar ............................ 703/14 |
| 6,678,868 B1 | * | 1/2004 | Lam .............................. 716/3 |
| 6,715,134 B1 | * | 3/2004 | Chang et al. ................... 716/4 |
| 6,775,810 B1 | * | 8/2004 | Chang et al. ................... 716/4 |
| 2003/0035375 A1 | * | 2/2003 | Freeman ..................... 370/238 |
| 2003/0040896 A1 | * | 2/2003 | McWilliams et al. ......... 703/13 |
| 2003/0188299 A1 | * | 10/2003 | Broughton et al. ......... 717/141 |
| 2003/0188302 A1 | * | 10/2003 | Chen et al. ................. 717/160 |
| 2004/0025073 A1 | * | 2/2004 | Soufi et al. ................. 713/400 |
| 2004/0068701 A1 | * | 4/2004 | Chang et al. ................... 716/4 |
| 2004/0133866 A1 | * | 7/2004 | Shim ............................. 716/6 |

OTHER PUBLICATIONS

"Efficient Simulation for Hierarchical and Partitioned Circuits", Maurer, Proceedings VLSI Design, pp. 236-241, IEEE 1999.*

(Continued)

*Primary Examiner*—Fred Ferris
(74) *Attorney, Agent, or Firm*—Osha Liang LLP

(57) ABSTRACT

A method for evaluating a logic state of a design node involves compiling a logic design to generate an annotated symbol table and a levelized design, obtaining a logic evaluation cost from the levelized design, locating a strategic node using the logic evaluation cost, marking the strategic node, and computing the logic state of the design node using the annotated symbol table, the strategic node, and the levelized design.

23 Claims, 12 Drawing Sheets

OTHER PUBLICATIONS

"A C-based RTL Design Verification Methodology for Complex Microprocessor", Yim et al, DAC 97', ACM 1997.*

Yu-Kwong Kwok and Ishfaq Ahamd; "*Dynamic Critical-Path Scheduling: An Effective Technique for Allocating Task Graphs to Multiprocessors*;" May 1996, pp. 506-521; vol. 7, No. 5, IEEE Transactions On Parallel and Distributed Systems.

Min-You Wu and Daniel D. Gajski; "*Hypertool: A Programming Aid For Message-Passing Systems*;" Jul. 1990, pp. 330-343, vol. 1, No. 3, IEEE Transactions On Parallel and Distributed Systems.

Jing-Jang Hwang, Yuan-Chieh Chow, Frank D. Anger, and Chung-Yee Lee; "*Scheduling Precedence Graphs In Systems With Interprocessor Communication Times*;" Apr. 1989, pp. 244-257, vol. 18, No. 2, Siam Journal Computing.

Gilbert C. Sih and Edward A. Lee; "*A Compile-Time Scheduling Heuristic for Interconnection-Constrained Heterogeneous Processor Architectures*;" Feb. 1993, pp. 175-187; vol. 4, No. 2, IEEE Transactions On Parallel and Distributed Systems.

Tao Yang and Apostolos Gerasoulis; "*DSC: Scheduling Parallel Tasks on an Unbounded Number of Processors*;" pp. 1-36, IEEE Transactions On Parallel and Distributed Systems.

Charles J. Alpert and Andrew B. Kahng; "*Recent Directions in Netlist Partitioning: A Survey*;" pp. 1-93, UCLA Computer Science Department.

William J. Dally, J. A. Stuart Fiske, John S. Keen, Richard A. Lethin, Michael D. Noakes, Peter R. Nuth, Roy E. Davison and Gregory A. Fyler; "*The Message-Driven Processor: A Multicomputer Processing Node with Efficient Mechanisms*;" Apr. 1992; pp. 24-39, IEEE Micro.

F. W. Howell, R. Williams, and R. N. Ibbett; *Hierarchical Architecture Design and Simulation Environment*; University of Edinburgh.

Quickturn Cobalt Webpage; "*Quickturn Boosts Speed, Flexibility In CoBalt 2.0*;" Apr. 20, 1998, pp. 1-4.

Vivek Sarkar; "*Partitioning and Scheduling Parallel Programs for Multiprocessors*;" Copyright 1989, pp. 1-201, The MIT Press.

* cited by examiner

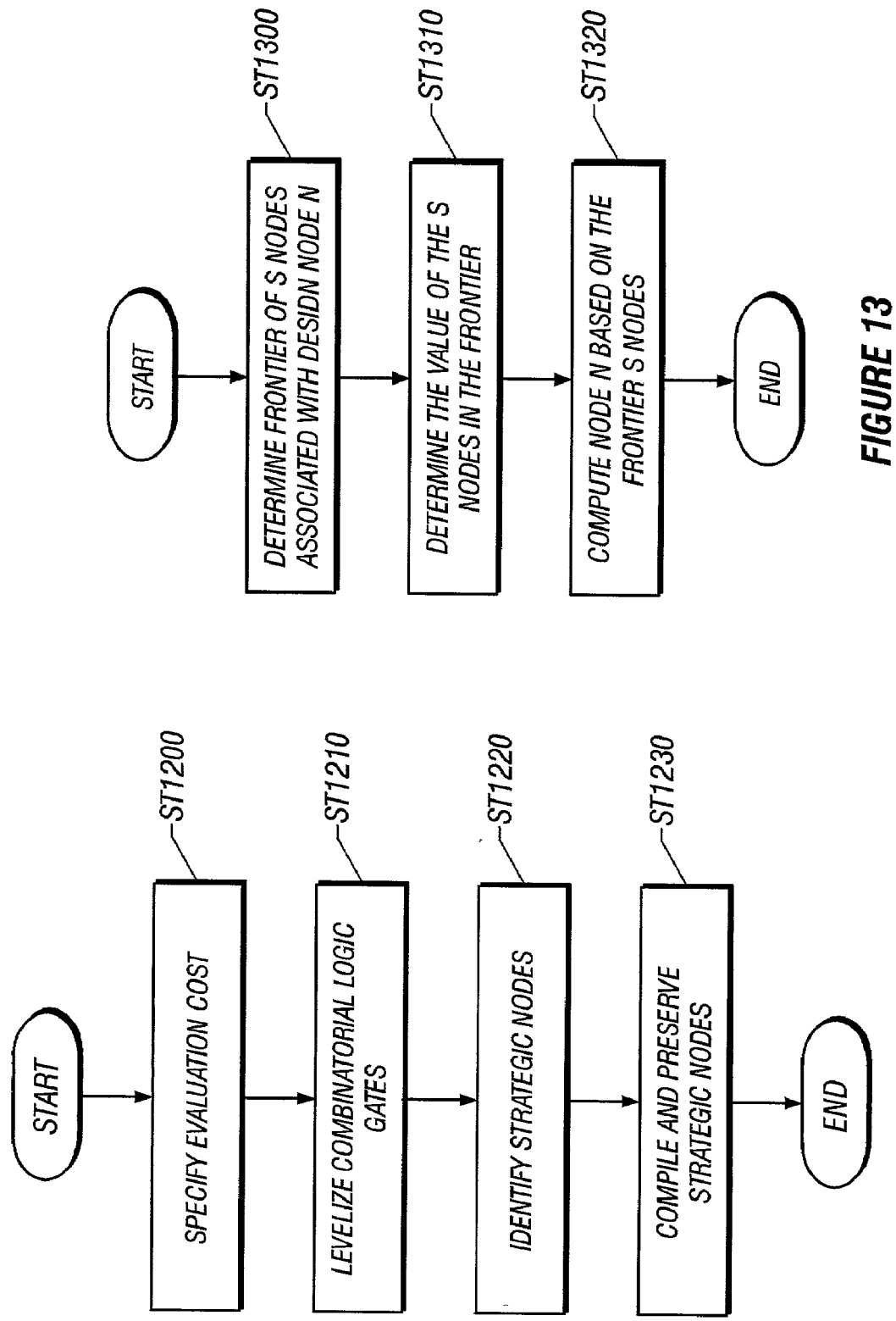

METHOD AND APPARATUS FOR EVALUATING LOGIC STATES OF DESIGN NODES FOR CYCLE-BASED SIMULATION

CROSS-REFERENCE TO RELATED APPLICATION

This application claims benefit of U.S. Provisional Application Ser. No. 60/313,762, filed Aug. 20, 2001, entitled "Phasers-Compiler Related Inventions," in the names of Liang T. Chen, Jeffrey Broughton, Derek Pappas, William Lam, Thomas M. McWilliams, Ihao Chen, Ankur Narang, Jeffrey Rubin, Earl T. Cohen, Michael Parkin, Ashley Saulsbury, and David R. Emberson.

BACKGROUND OF INVENTION

Modern high performance microprocessors have an ever-increasing number of circuit elements and an ever-rising clock frequency. Also, as the number of circuits that can be used in a CPU has increased, the number of parallel operations has risen. Examples of efforts to create more parallel operations include increased pipeline depth and an increase in the number of functional units in super-scalar and very-long-instruction-word architectures. As CPU performance continues to increase, the result has been a larger number of circuits switching at faster rates. Thus, from a design perspective, important considerations, such as the time needed to complete a simulation and the time needed to debug a CPU, are taken into account.

As each new CPU design uses more circuit elements, each often operating at increased frequencies, the time required to simulate the design increases. Due to the increased time for simulation, the number of tests, and consequently the test coverage, decreases. In general, the result is an increase in the logic errors that escape detection before the CPU is manufactured.

After a CPU prototype is initially manufactured and failure modes are uncovered, determining failure mechanisms is time intensive due to the increased CPU complexity. Failure modes may be the result of logic errors or poor manufacturability of a circuit element. In both cases, circuit simulation helps to confirm or refute the existence of a logic error. If no logic errors exist, the manufacturability of a circuit element may be the cause of the failure mode. Even after a logic error failure mechanism is discovered and a solution is proposed, a substantial amount of time may be required to satisfactorily determine that the proposed solution fixes the logic error and does not generate any new logic errors. Circuit simulation is key to the design and debugging of increasingly complex and faster CPUs.

CPU simulation may occur at a "switch-level." Switch-level simulations typically include active circuit elements (e.g., transistors) and passive circuit elements (e.g., resistors, capacitors, and inductors). A typical switch-level circuit simulator is "SPICE", which is an acronym for Simulation Program with Integrated Circuit Emphasis. SPICE typically models each element using an equation or lookup table. SPICE can model accurately the voltage and/or current of each circuit element across time.

CPU simulation also may occur at a "behavioral level." Behavioral level simulations typically use a hardware description language (HDL) that determines the functionality of a single circuit element or group of circuit elements. A typical behavioral level simulation language is "Verilog," which is an Institute of Electrical and Electronics Engineers (IEEE) standard. Verilog HDL uses a high-level programming language to describe the relationship between the input and output of one or more circuit elements. The Verilog HDL describes on what conditions the outputs should be modified and what effect the inputs have. Verilog HDL programs may also be used for logic simulation at the "register transfer level" (RTL).

Using the Verilog HDL, for example, digital systems are described as a set of modules. Each module has a port interface, which defines the inputs and outputs for the module. The interface describes how the given module connects to other modules. Modules can represent elements of hardware ranging from simple gates to complete systems. Each module can be described as an interconnection of sub-modules, as a list of terminal elements, or a mixture of both. Terminal elements within a module can be described behaviorally, using traditional procedural programming language constructs such as "if" statements and assignments, and/or structurally as Verilog primitives. Verilog primitives include, for example, truth tables, Boolean gates, logic equation, and pass transistors (switches).

HDL languages, such as Verilog, are designed for efficient representation of hardware designs. Verilog has support for handling signals of arbitrary widths, not only for defining and using an arbitrary width signal, but for treating any sub-field of such a signal as a signal in its own right.

Cycle-based logic simulation is applicable to synchronous digital systems and may be used to verify the functional correctness of a digital design. Cycle-based simulators use algorithms that eliminate unnecessary calculations to achieve improved performance in verifying system functionality. Typically, in a cycle-based logic simulator the entire system is evaluated once at the end of each clock cycle. Discrete component evaluations and re-evaluations are typically unnecessary upon the occurrence of every event.

HDL simulations may be event-driven or cycle-based. Event-driven simulations propagate a change in state from one set of circuit elements to another. Event-driven simulators may record relative timing information of the change in state so that timing and functional correctness may be verified. Cycle-based HDL simulations also simulate a change in state from one set of circuit elements to another. Cycle-based HDL simulations, however, evaluate the state of the system once at the end of each clock cycle. While specific intra-cycle timing information is not available, simulation speed is improved.

HDL simulations may be executed on reconfigurable hardware, such as a field programmable gate array (FPGA) chip. The FPGA allows dedicated hardware to be configured to match the HDL code. FPGA hardware provides a method to improve the simulation time. As the design changes, the time required to reconfigure the FPGA arrangement may prohibit the running of many iterations. Also, the number of FPGA chips required for complex designs may be relatively large.

HDL simulations also may be executed on general purpose processors. General purpose processors, including parallel general purpose processors, are not designed specifically for HDL simulations. HDL simulations require a large number of operations of inputs and outputs that use bit-wise operations.

Large logic simulations are frequently executed on parallel or massively parallel computing systems. For example, parallel computing systems may be specifically designed parallel processing systems or a collection, referred to as a "farm," of connected general purpose processing systems. FIG. 1 shows a block diagram of a typical parallel computing system (100) used to simulate an HDL logic design. Multiple processor arrays (112a, 112b, 112n) are available to simulate the HDL logic design. A host computer (116), with associated data store (117), controls a simulation of the logic design that executes on one or more of the processor arrays (112a, 112b, 112n) through an interconnect switch (118). The processor arrays (112a, 112b, 112n) may be a collection of processing elements or multiple general purpose processors. The interconnect switch (118) may be a specifically designed interconnect or a general purpose communication system, for example, an Ethernet network.

A general purpose computer (120) with a human interface (122), such as a graphical user interface (GUI) or a command line interface, together with the host computer (116) support common functions of a simulation environment. These functions typically include an interactive display, modification of the simulation state, setting of execution breakpoints based on simulation times and states, use of test vectors files and trace files, use of HDL modules that execute on the host computer and are called from the processor arrays, check pointing and restoration of running simulations, the generation of value change dump files compatible with waveform analysis tools, and single execution of a clock cycle.

HDL logic designs are generally processed by a system known as a "compiler" before the logic design can be executed in a cycle-based simulator. Traditionally, cycle-based compilers only calculate and store the logic state for those circuit nodes representing the outputs of sequential logic devices (e.g., flip-flops and latches), referred to herein as "state nodes." No logic state is stored for intermediate nodes that represent the outputs of combinatorial logic elements. Thus, when a designer wishes to test (by tracing or probing) the logic states of a given combinatorial logic element (referred to herein as a "design node"), one alternative is to re-compile the entire logic design to preserve the tracing nodes. Another alternative is to generate the logic state of the design node from the nearest state node or nodes, separately evaluating all levels of combinatorial logic in between the state nodes and the selected design node. This separate evaluation is performed by evaluating the logic expression of the design node's logic cone. The logic cone of a design node is a combinatorial logic tree bounded by the state nodes and the design node.

If the logic cone is large and has many logic levels many evaluation steps are necessary to calculate the logic state of a design node. With reference to FIG. 2, the logic cone of a design node is displayed. Design node (E) and state nodes (Q1 and Q2) define the boundaries of a logic cone (200). Within the logic cone (200) are five combinatorial logic elements A, B, C, D, and E. Five evaluation steps are necessary to calculate the logic state of design node E shown in FIG. 2

SUMMARY OF THE INVENTION

In general, in one aspect, the invention relates to a method for evaluating a logic state of a design node. The method comprises compiling a logic design to generate an annotated symbol table and a levelized design, and computing the logic state of the design node using the annotated symbol table and the levelized design.

In general, in one aspect, the invention relates to a method of evaluating a logic state of a design node. The method comprises modifying a portion of a logic design to create a modified logic design, updating an annotated symbol table and a levelized design using the modified logic design, and computing a modified logic state of the design node using the annotated symbol table and the levelized design.

In general, in one aspect, the invention relates to a computer system for evaluating a logic state of a design node. The computer system comprises a processor, a memory, an input means, and software instructions stored in the memory for enabling the computer system under control of the processor, to perform compiling a logic design to generate an annotated symbol table and a levelized design, and computing the logic state of the design node using the annotated symbol table and the levelized design.

In general, in one aspect, the invention relates to a computer system to evaluate a logic state of a design node. The computer system comprises a processor, a memory, an input means, a display device, and software instructions stored in the memory for enabling the computer system under control of the processor, to perform modifying a portion of a logic design creating a modified logic design, updating an annotated symbol table and a levelized design using the modified logic design, computing a modified logic state of the design node using the annotated symbol table and the levelized design, and verifying the modified logic state of the design node.

In general, in one aspect, the invention relates to an apparatus for evaluating a logic state of a design node. The apparatus comprises means for compiling a logic design to generate an annotated symbol table and a levelized design and means for computing the logic state of the design node using the annotated symbol table and the levelized design.

In general, in one aspect, the invention relates to an apparatus for evaluating a logic state of a design node. The apparatus comprises means for modifying a portion of a logic design creating a modified logic design, means for updating an annotated symbol table and a levelized design using the modified logic design, means for computing a modified logic state of the design node using the annotated symbol table and the levelized design, and means for verifying the modified logic state of the design node.

Other aspects and advantages of the invention will be apparent from the following description and the appended claims.

BRIEF DESCRIPTION OF DRAWINGS

FIG. 12 shows a flow diagram of selecting strategic nodes heuristically in accordance with an embodiment of the invention.

FIG. 13 shows a flow diagram describing the evaluation of non-strategic nodes in accordance with an embodiment of the invention.

DETAILED DESCRIPTION

Figure 1:
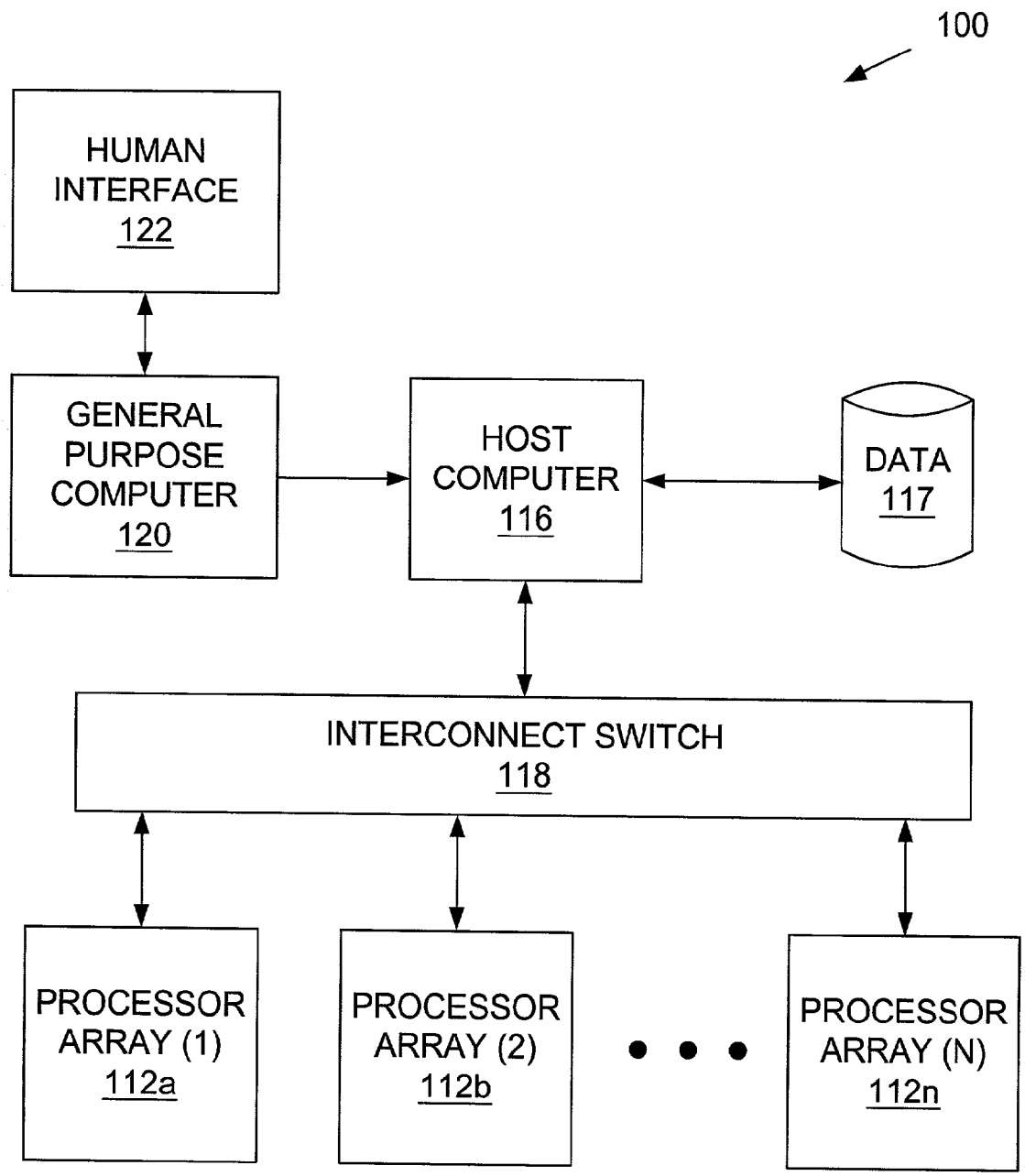
FIG. 1 shows a typical parallel computer system.
Figure 2:
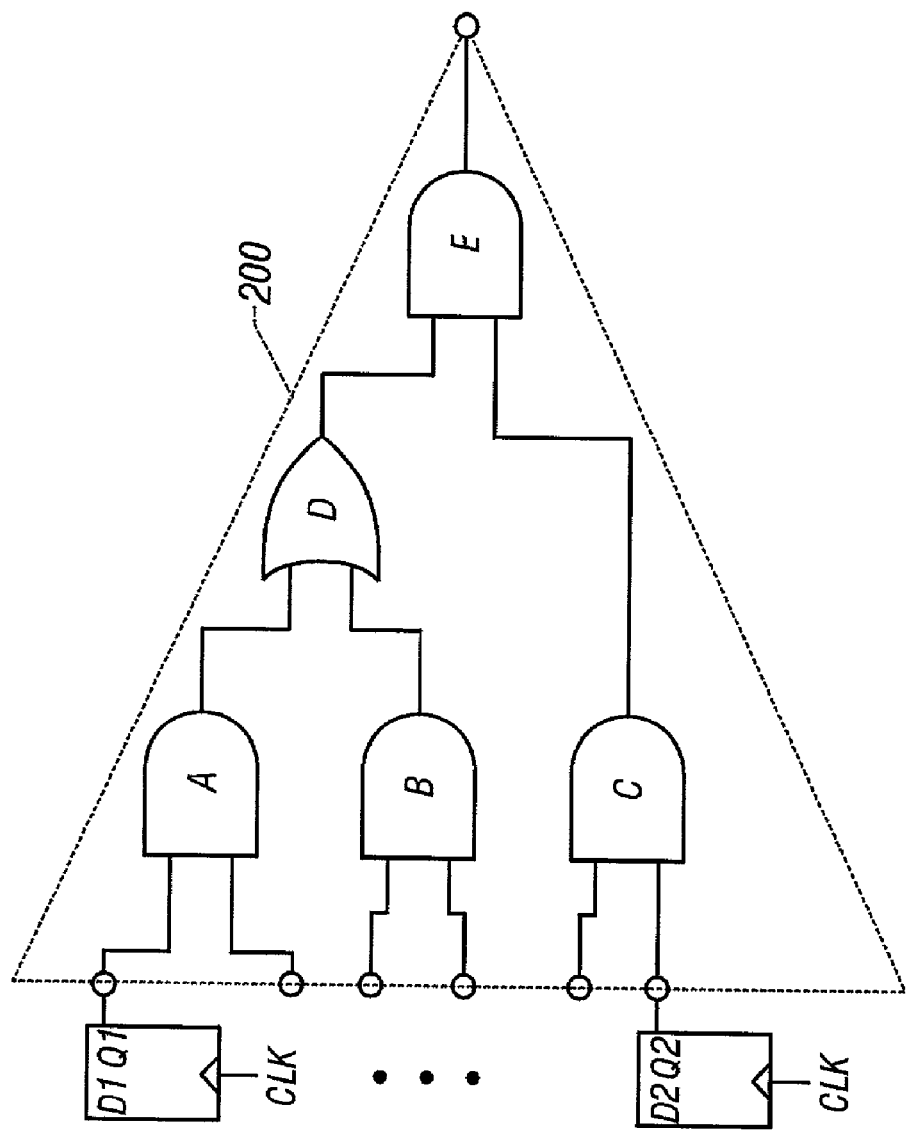
FIG. 2 shows the logic cone of a design node.

Specific embodiments of the invention will now be described in detail with reference to the accompanying figures. Like elements in the various figures are denoted by like reference numerals for consistency.

The present invention involves a method and apparatus for evaluating the logic states of design nodes for cycle-based simulation. The evaluation of the logic states of the design nodes avoids re-compilation of a logic design in order to make all design nodes accessible. Further, a run-time simulation environment provides the ability to operate in a "patch environment." This allows a user to change the logic design and verify whether the change properly fixes a problem in the logic design within a simulation system without necessitating a re-compilation. The present invention can be applied to any cycle-based, logic simulation system implemented in hardware or software. In the following detailed description of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

A computer execution environment and a class of simulation systems, e.g., multiple instruction, multiple data (MIMD), used with one or more embodiments of the invention is described with reference to FIGS. 3–5. The system on which a compiled hardware design logic may be executed in one or embodiments of the invention is a massively parallel, cycle-based computing system. The system uses an array of execution processors arranged to perform cycle-based computations. One example of cycle-based computation is simulation of a cycle-based design written in a computer readable language, such as HDL (e.g., Verilog, etc.), or a high-level language (e.g., Occam, Modula, C, etc.).

Figure 3:
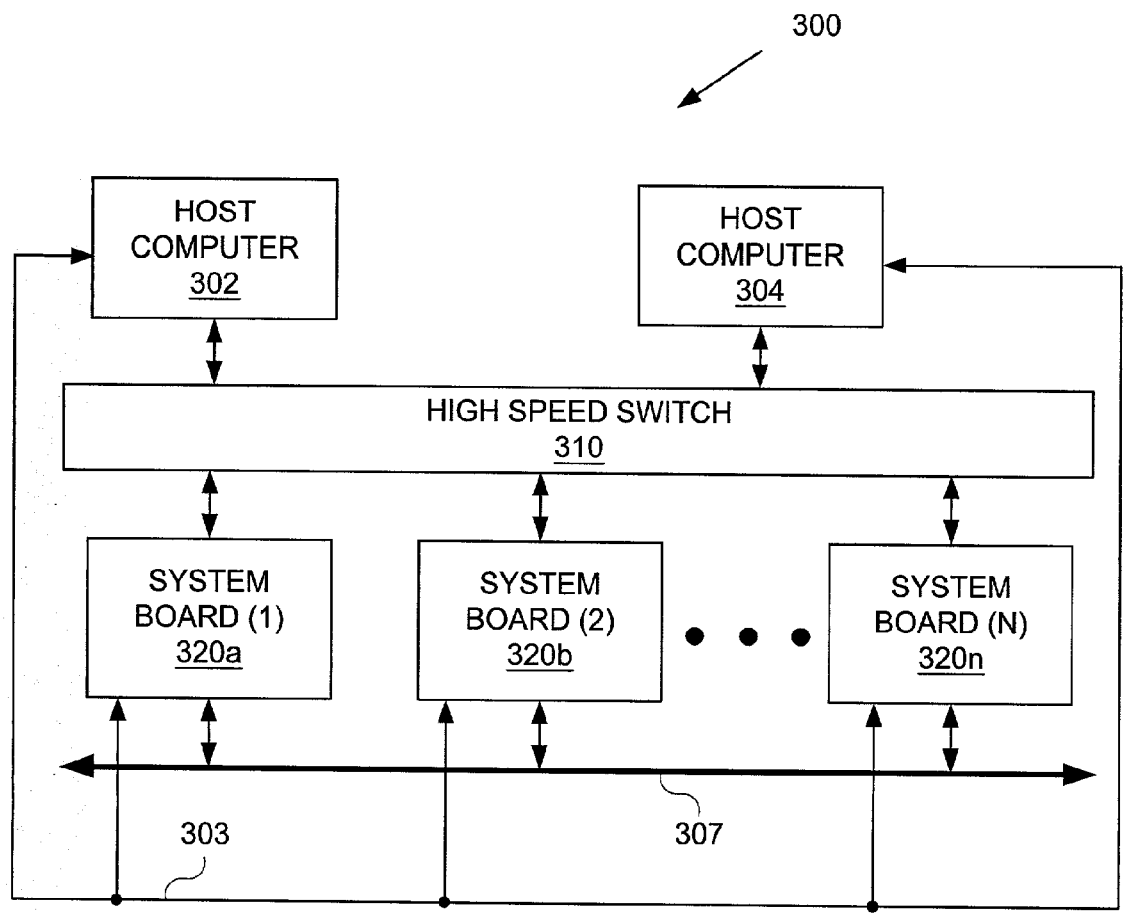
FIG. 3 shows a parallel computer system in accordance with an embodiment of the present invention.
Figure 4:
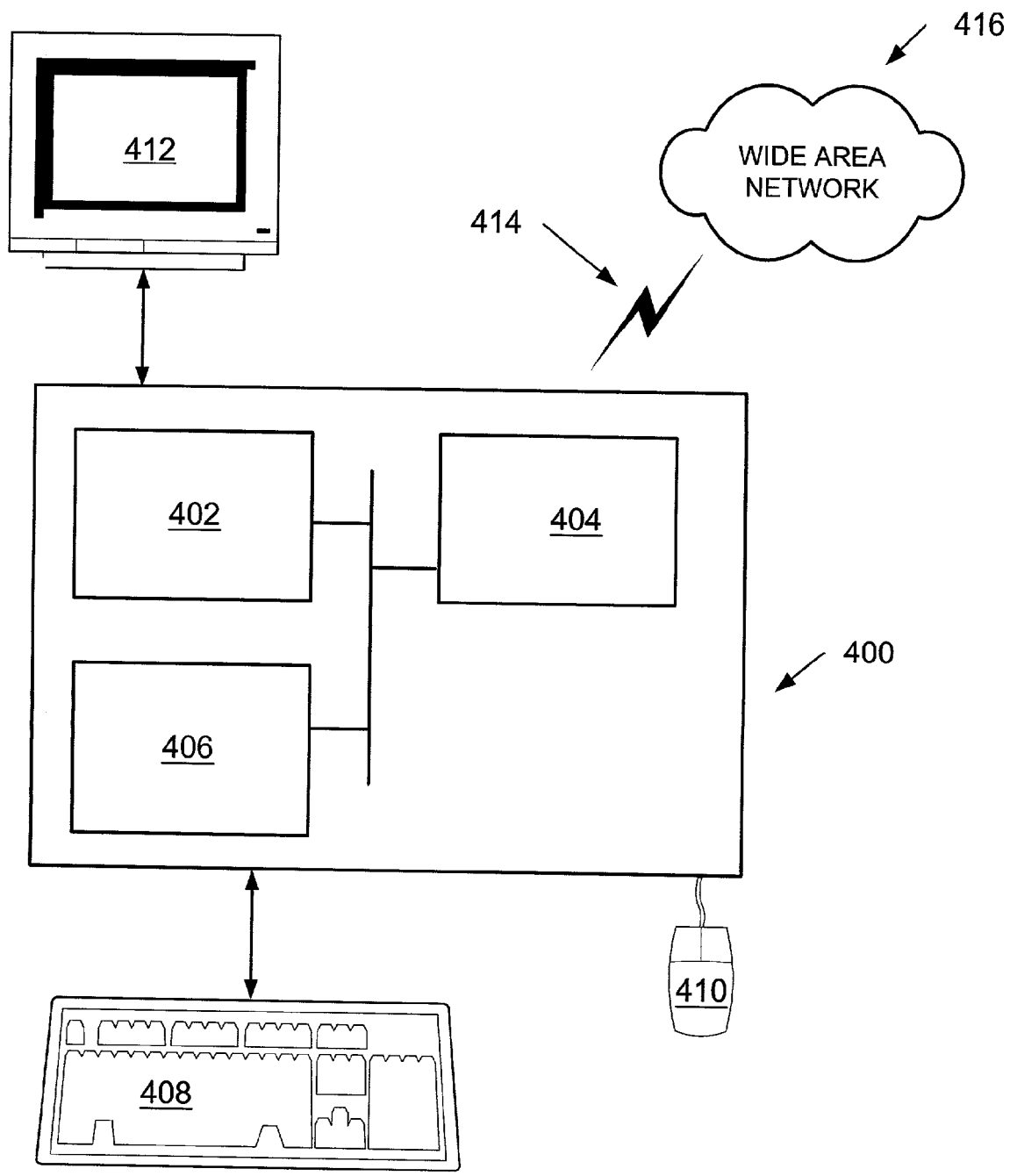
FIG. 4 shows a general purpose computer system.

FIG. 3 shows exemplary elements of a massively parallel, cycle-based computing system (300), in accordance with one or more embodiments of the present invention. Cycle-based computation, such as a logic simulation on the system (300), involves one or more host computers (302, 304) managing the logic simulation(s) executing on one or more system boards (320a, 320b, 320n). Each system board contains one or more Application Specific Integrated Circuits (ASIC). Each ASIC contains multiple execution processors. The host computers (302, 304) may communicate with the system boards (320a, 320b, 320n) using one of several pathways. The host computers (302, 304) include interface hardware and software as needed to manage a logic simulation. A high speed switch (310) connects the host computers (302, 304) to the system boards (320a, 320b, 320n). The high speed switch (310) is used for loading and retrieval of state information from the execution processors located on ASICs on each of the system boards (320a, 320b, 320n). The connection between the host computers (302, 304) and system boards (320a, 320b, 320n) also includes an Ethernet connection (303). The Ethernet connection (303) is used for service functions, such as loading a program and debugging. The system also includes a backplane (307). The backplane (307) allows the ASICs on one system board to communicate with the ASICs of another system board (320a, 320b, 320n) without having to communicate with an embedded controller located on each system board. Additional system boards may be added to the system by connecting more system boards to the backplane (307).

A processor array may exist as specialized hardware, such as a massively parallel computer system designed for simulation using cycle-based computation, or as part of an appropriate computer system, such as a SPARC™ workstation produced by Sun Microsystems, Inc. Cycle-based logic design may also be simulated on a processor array, or a portion of the processor array. Thus, references herein to the processor array may refer to a portion of the processor array, or to multiple processor arrays.

In one or more embodiments of the present invention, the computer execution environment to perform evaluation of design nodes in a cycle-based, logic simulation system may be a general purpose computer, such as a SPARC™ workstation produced by Sun Microsystems, Inc. For example, as shown in FIG. 4, a typical general purpose computer (400) has a processor (402), associated memory (404), a storage device (406), and numerous other elements and functionalities typical to today's computers (not shown). The computer (400) has associated therewith input means such as a keyboard (408) and a mouse (410), although in an accessible environment these input means may take other forms. The computer (400) is also associated with an output device such as a display device (412), which may also take a different form in an accessible environment. The computer (400) is connected via a connection means (414) to a Wide Area Network (WAN) (416). The computer (400) may be interface with a massively parallel, cycle-based computing system described above and as shown in FIG. 3.

Figure 5:
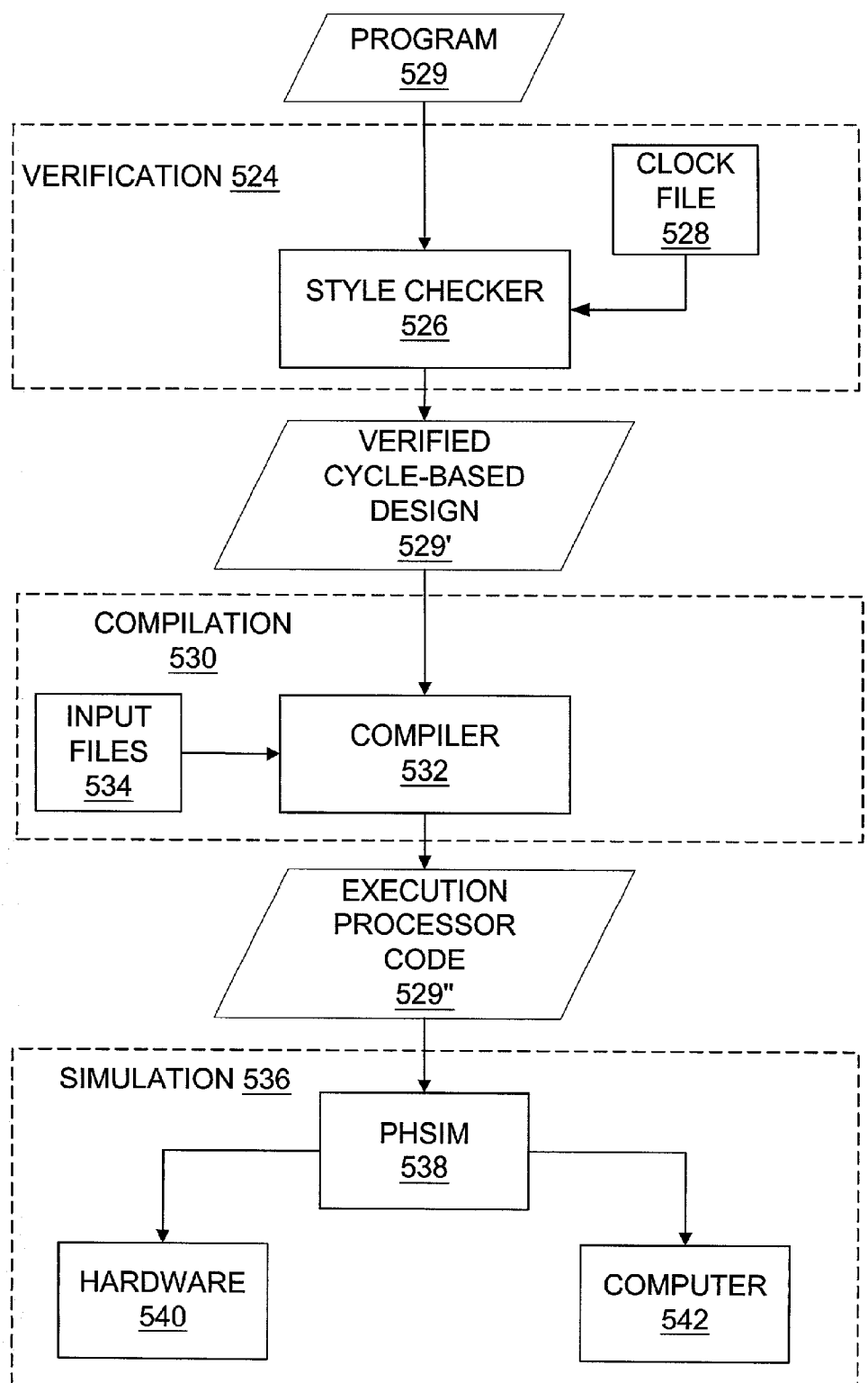
FIG. 5 shows a process of preparing a simulation of a cycle-based logic design to run on a cycle-based system in accordance with an embodiment of the present invention.

In accordance with one or more embodiments of the present invention, FIG. 5 shows a process of preparing a simulation of a cycle-based logic design to run on a cycle-based system. The process includes three separate phases. The first phase is a verification phase (524). This phase includes a style checker (526), which parses and checks high level design code of a program (529) representing the cycle-based design. The program is checked for adherence to a cycle-based design standard, e.g., synchronous logic design, no combinatorial logic loops, etc. An error action during this phase results from nonconformance to the defined cycle-based design standards. A clock file input (528) defines clocks cycles for the simulation. The output of the verification phase produces a verified cycle-based design (529').

The second phase is a compilation phase (530), which receives the verified cycle-based design (529') as input from the verification phase (524). The compilation phase (530) uses a translation component, such as a compiler (532), to compile the verified cycle-based design (529') of the verification phase (524).

The compiler (532) decomposes the verified cycle-based design into execution processor code that may be executed in parallel on a processor array of the cycle-based system by one or more execution processors. The compiler (532) also produces routing tables and other information, such as routing processor code, interface code and an annotation symbol table. Routing tables enable static routing of messages sent during run mode segment. An annotation symbol table involves recording physical locations where the values of nets and registers have been stored, so that user interface and Programming Language Interface (PLI) routines may access values of nets and registers during runtime.

Input files (534), e.g., PLI files, etc., provide functionality for items such as system task calls. A user system task call enables a host computer to execute an appropriate portion of a simulation.

Errors in cycle-based designs input into the compiler (532) causes an error action. The compiler and code generation includes a scheme for routing of messages and placement of compiled execution processor code so that there is some optimization in the choice of which of the parallel execution processors of the simulation hardware to use for certain tasks. This is because the time required for delivery of a message from one processor to another depends upon the data connection component between those execution processors, i.e., the number of hops the message takes in traversing the data connection component from source processor to destination processor. One skilled in the art can appreciate that compilation of a program may be targeted to a specific execution environment and/or platform, e.g., Phaser system hardware or an appropriate computer, such as a SPARC™ workstation produced by Sun Microsystems, Inc.

The third phase is the simulation phase (536), which receives input in the form of execution processor code (529") from the compilation phase (530). A Phaser Simulator (PHSIM) (538) typically runs on a host computer, and controls and monitors execution of simulations executing on the cycle-based system. The host computer includes such hardware and software mechanisms as are needed to manage simulation, e.g., loading execution processor code onto a processor array. PHSIM (538) enables user interaction with a simulation using a GUI or with a command line interface, interactive modification of simulation state, breakpointing, test vector use, system task functionality, signal tracing, single-stepping on clock cycles, and other functionalities. A simulation cycle begins with one or more simultaneous clock edges and completes when every dependent events has completed evaluation. The simulation phase (536) may run on system hardware (540), which is designed for cycle-based computation, or on an appropriate computer, such as a SPARC™ workstation (542) produced by Sun Microsystems, Inc.

The computer systems described above are for purposes of example only. Embodiments of the invention may be implemented in any type of computer system or programming or processing environment.

Figure 6:
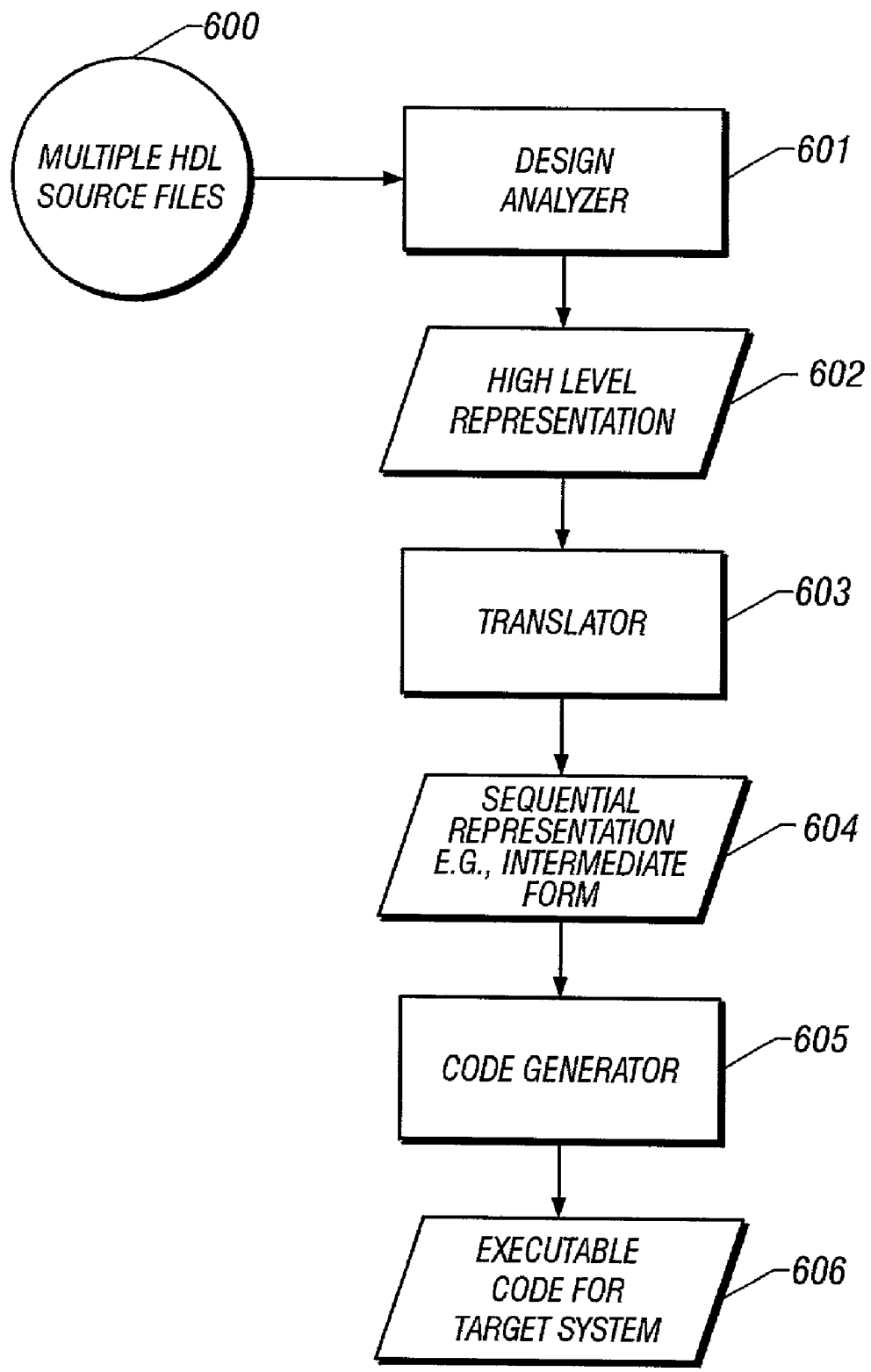
FIG. 6 shows a flow diagram of a simulation compiler in accordance with an embodiment of the invention.

As shown in FIG. 6, in one or more embodiments of the invention, the simulation compiler includes a design analyzer (601), a translator (603), and a code generator (605). The design analyzer (601) receives input in the form of HDL source files (600) (e.g., Verilog modules) and generates a high-level representation (602) of the simulation design, ordered for single-pass execution in a cycle-based system. This high-level representation (602) may include, for example, a component reference data structure (i.e., an object-oriented data structure) containing shared information for component types, a component instance data structure containing information for specific component instances as well as flattened connectivity information, components (instances) collected by type, a list of simulation variables, and a sorted component list, in which the sort order corresponds to the execution order for single-pass, cycle-based execution. The translator (603) receives the high level representation (602) and translates the operations into a sequential representation (or intermediate form) (604) that describes the simulation operations. The sequential representation (604) is transformed by code generation process (605) into executable code (606) for a target simulation system.

It will be apparent to one skilled in the art that the techniques described in association with the design analyzer (601) render an elaborated logic design suitable for use with all classes of computer-aided logic design tools. For example, the simulator described herein, a power-analysis, or a fault-grading tool.

Furthermore, the translator (603) may direct execution of the program through a variety of mechanisms, including production of a sequential representation (604) described herein, production of a program in a language such as C, production of assembly language or binary instructions for the target simulation system, or by direct interpretation of the prescribed operations.

The design analyzer (601), translator (603), and code generator (605), mechanisms may be used with any target simulation system. For example, the sequential representation (604) may be transformed into a sequential program for execution on a general purpose or application specific computer, or may be partitioned into a plurality of threads for execution on an MIMD simulation system.

Figure 7:
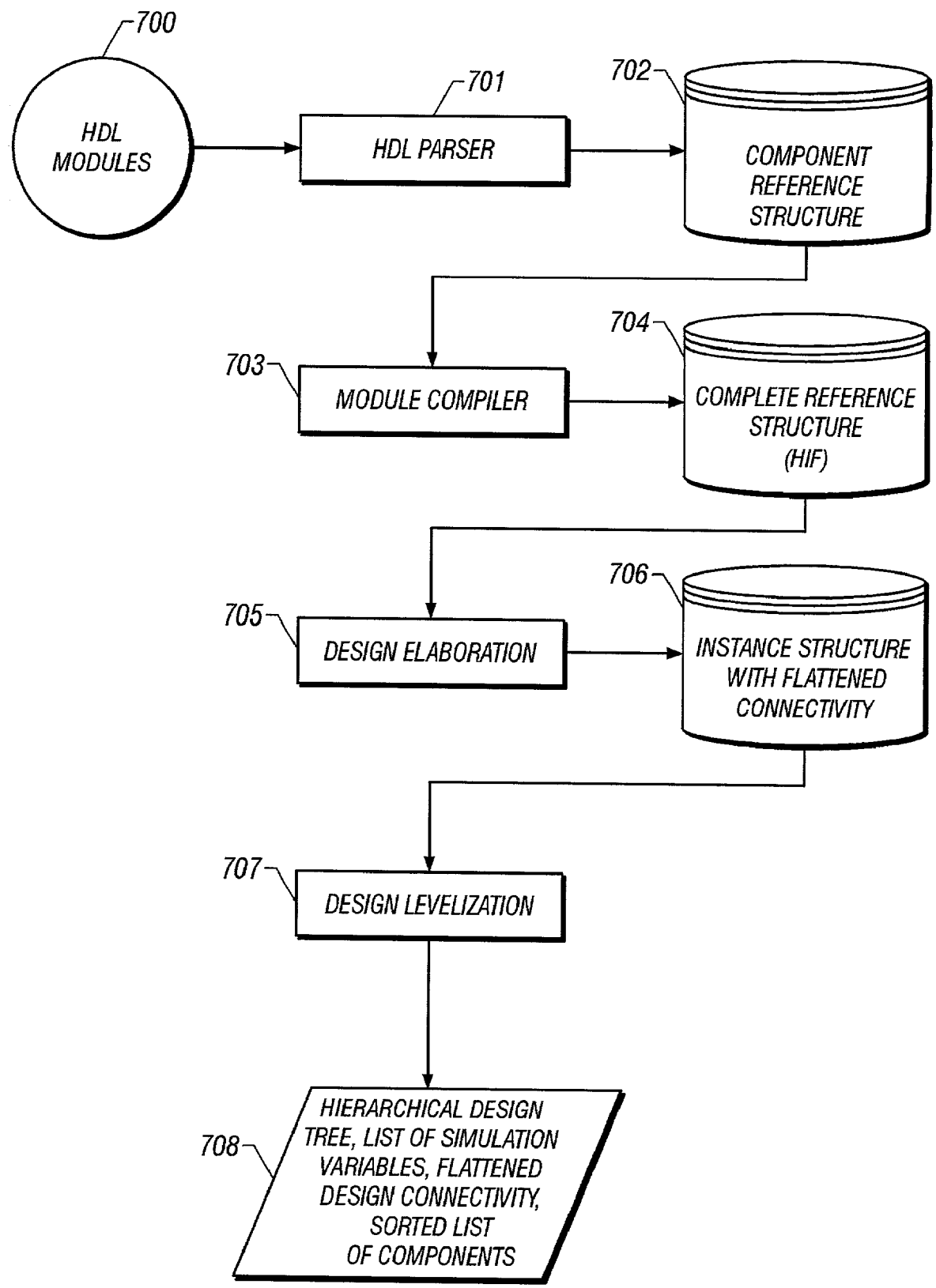
FIG. 7 shows a flow diagram of design analysis in accordance with an embodiment of the invention.

The flow of an embodiment of the design analyzer (601) is shown in the flow diagram of FIG. 7. One or more HDL modules (700) are provided to an HDL parser (701). The modules are then parsed to generate the component reference data structure (702). A component reference data structure (702) contains, for example, one component object definition for each module item submitted. Those component object definitions provide the basis for component instantiation in later stages. A module compiler (703) expands the object definitions from the reference data structure (702) and extracts the logic modeling and pin information for each component. A logic inference function is applied to each component to determine the logic content. A complete reference data structure (704) in a high-level abstract representation, referred to herein as Hierarchical Intermediate Form (HIF) or Verilog Intermediate Form (VIF), is generated after the module compilation.

In a design elaboration phase (705), the compiled design modules are linked together into a hierarchical design tree, from which instances of component objects are recursively generated. Binding is performed and simulation variables are created for local nets. The output of the design elaboration phase (705) is an elaborated instance data structure (706) with flattened connectivity information. A design levelization phase (707) operates upon an instance data structure (706) to collect all components by logic type and formulates a hierarchical design tree, a sorted list of components in execution order, a list of simulation variables, and a flattened design connectivity (708). The following description discusses the above compilation steps in greater detail.

Figure 8:
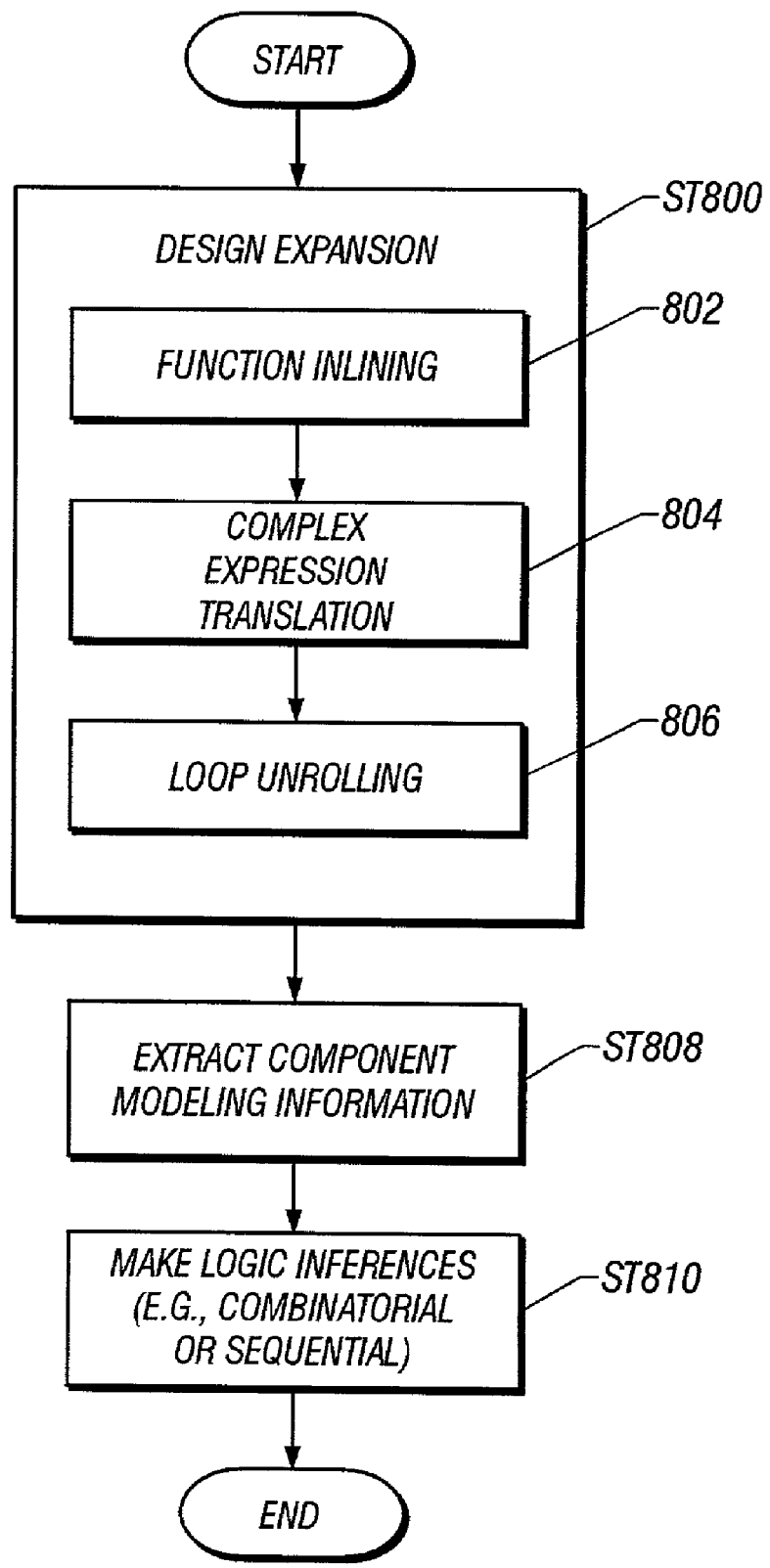
FIG. 8 shows a flow diagram of a module compiler process in accordance with an embodiment of the invention.

The module compiler (703) operates upon the initial design reference data structure (702) to build a more complete logic model for each module, now expressed as a component object type. The module compilation process, in accordance with one or more embodiments of the invention, is shown in the flow diagram of FIG. 8.

The module compilation process begins with design expansion (Step 800). Design expansion (Step 800) includes three operations: function/task inlining (802), complex expression translation (804), and loop unrolling (806).

The module items, now expressed as the component object type, hereinafter "component," models a hardware device in HDL. The component is also a basic concurrent execution unit in simulation. In Verilog, a component is defined to be a gate, a primitive, a continuous assign statement, or a process. A component pin is defined as a terminal point of the component that connects to the external environment. If the component is a primitive, the component pins are the primitive pins. If the component is a continuous assign statement, the component pins are the Verilog variables or part selected variables of the statement left hand side (LHS) and right hand side (RHS) expressions. If the component is a process, the component pins are the Verilog variables or part selected variables of each statement in the process, except the variables that are used only internally to the process.

Following design expansion (800), the component modeling information is extracted from the component (Step 808). This extraction step includes, for example, the extraction of pin information from the component. Pin information may be gathered from the arguments or expressions of the component. For example, x and y may be variables in an expression of a continuous assign statement (e.g., assign x=y). The type of pin (e.g., in, out, inout, etc.) may be determined from the internal code of the component.

In Step 810, the software analyzes the statement content of the component to infer the logic content of the component. The object is to classify a component as a sequential logic component or a combinatorial logic component. A sequential logic component is defined as a component that can store logic states across cycle boundaries. If not, the component is a combinatorial logic component.

Design levelization is performed in one or more embodiments of the invention to facilitate the generation of cycle-based simulation code that can evaluate all simulated elements exactly once to arrive at a steady state, for a given simulation clock cycle, with a single pass of the generated code. To this end, the instance data structure generated by the design elaborator is analyzed, to collect components (i.e., instances) by type (e.g., clock logic, sequential logic, data logic, initial logic, etc.), as well as to identify any possible conflict issues, such as combinatorial logic loops. After the levelization analysis is performed, the logic components are sorted according to type to determine an execution order that results in a single pass solution (i.e., one-time evaluation of each component per simulation clock cycle).

Figure 9:
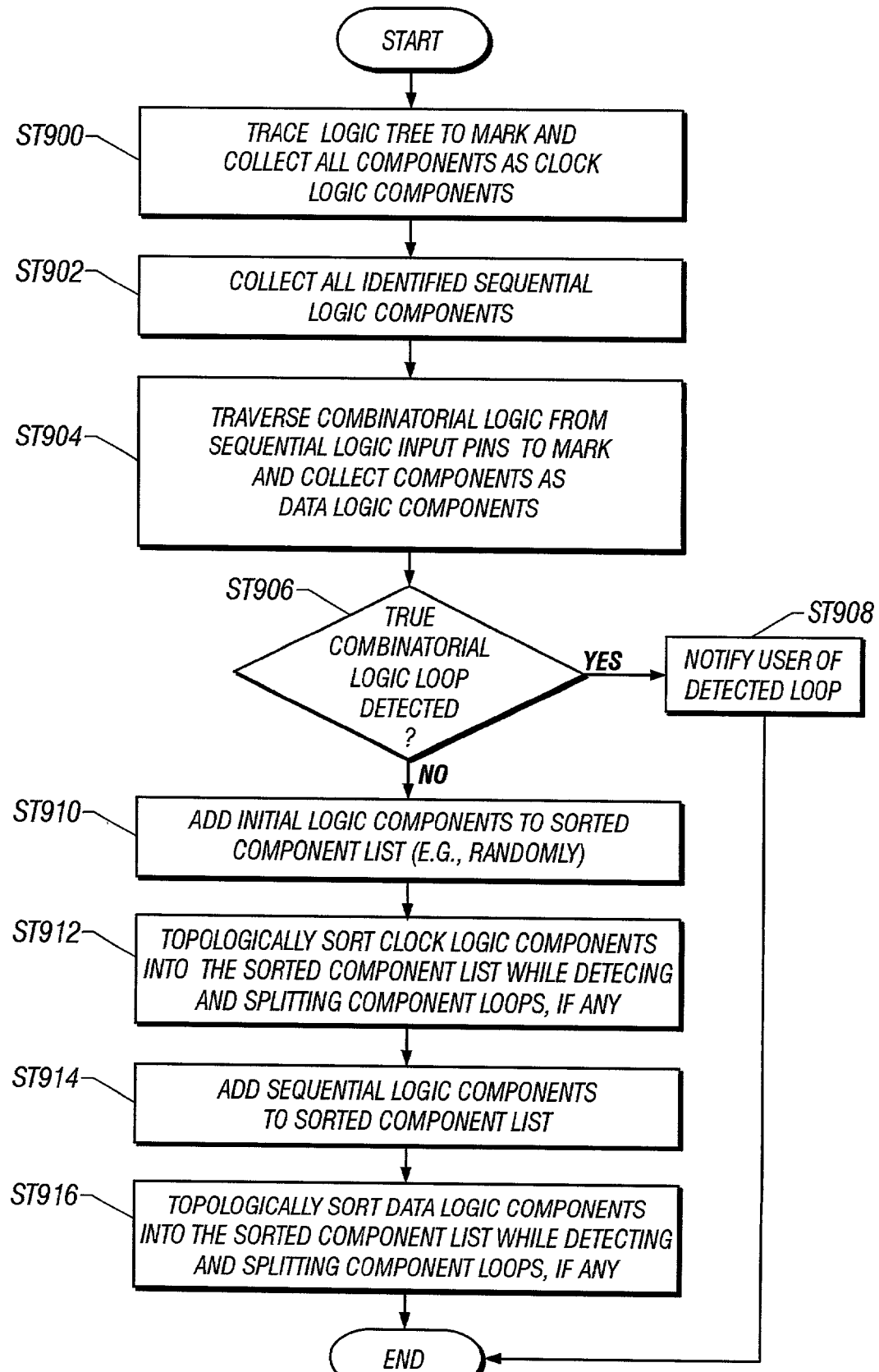
FIG. 9 shows a flow diagram of a levelization process in accordance with an embodiment of the invention.

FIG. 9 shows a flow diagram of one embodiment of a levelization process. In Step 900, all "clock logic" components are identified and collected. Clock logic refers to those combinatorial components that are evaluated prior to a clock signal reaching the clock pin of a sequential logic device. The identification of clock logic components may be accomplished, for instance, by performing a trace of the clock logic tree. For example, given a user defined clock source signal, a tracing routine may trace through all logic nets and combinatorial logic components until each branch in the clock tree reaches a terminus at a known clock pin of a sequential logic component. Each combinatorial logic component passed in the trace is marked and collected as a clock logic component. If a data input pin of a sequential logic component is encountered instead of a clock pin, a warning message may be printed that indicates a possible design error.

In Step 902, all sequential logic components are collected. The sequential components are known, for example, because the components were inferred from the prior "logic inference" (Step 810). Those combinatorial logic components that reside in data nets between sequential logic output and input pins or between the external input/outputs of the circuit and the sequential elements are marked and collected as "data logic" components (Step 904). The identification of data logic components may be accomplished, for example, by traversing backwards from an input pin of a sequential logic component, through all intervening combinatorial logic components, until the output pin of another sequential logic component is reached. All combinatorial logic components traversed in this manner are marked and collected as data logic components.

In one or more embodiments, during the traversal described above (Step 904), the levelization process detects any combinatorial logic loops. A combinatorial logic loop is defined as a logic data path from a design node coming back to the same node through some combinatorial logic components without going through a sequential element. A combinatorial logic loop can prevent complete evaluation of the simulated circuit in a single pass. For example, the logical value at the input of a previously evaluated component may be altered by a logic loop, requiring re-evaluation of the component until a steady state is reached within the loop. Because re-evaluation is contrary to the desired goal of a single pass solution, a determination is made when a combinatorial logic loop is detected (Step 906), and the user is notified in some manner (e.g., an error or warning is indicated in an alert window or logged to a file) in the instance of a loop detection event (Step 908). In one or more embodiments, a loop detection event ends or stalls the compilation process, so that the user may correct the HDL program before continuing.

Once all components have been collected in separate groups, (e.g., clock logic, sequential logic, and data logic), the components are sorted into a component list, the order of which specifies the execution order for evaluation of those components. The group order (e.g., clock logic components before sequential logic components) ensures that the inputs for a given type of component have been evaluated prior to evaluation of that given component. For example, evaluation of sequential logic components is safe once all clock logic components have been evaluated, and evaluation of all data logic components is safe once all sequential logic components have been evaluated. An embodiment of this sorting process is described in Steps 910–916.

Any "initial" logic components are added to the sorted component list in an arbitrary order (Step 910), i.e., order within the subgroup does not matter. "Initial" logic components are components associated with "initial" Verilog statements, or other similar HDL constructs, that are evaluated once at the beginning of a simulation (e.g., to initialize specific simulation variables). These logic components are placed first in the sorted component list. The relative ordering of the initial logic components may be arbitrarily determined, for example.

All clock logic components are added to the end of the sorted component list (Step 912). The order in which the respective clock logic components are placed into the list may be determined topologically. For example, during traversal of the clock tree, each node between components may be labeled with a level number, the source clock signal representing level 0. The output of each clock logic component is given a label that is one greater than the maximum of the levels assigned to its input pins. The clock logic components can then be sorted in dependency order according to the levels assigned to their output pins, upward from one. Components with the same level numbers can be placed in an arbitrary order. All sequential logic components (e.g., flip-flops) are added to the end of the sorted component in an arbitrary order (Step 914).

All data logic components are added to the end of the sorted component list (Step 916). As with the clock logic components, the data logic components are ordered in topological fashion. A similar mechanism (i.e., assigning levels during traversal from an origin, for instance a sequential logic component output pin), may be used to sort the data logic components in a manner that accounts for data dependencies. In one embodiment, the sorted data logic components may provide a basis to evaluate design nodes in real-time and without the need to re-compile.

The output of the design levelization phase is a sorted list of components in execution order, as well as a list of simulation variables. The steps of sorting the collected components may be considered part of a translation phase performed by the translator (603), with prior component collection steps considered a logic network analysis portion of the design analysis phase performed by the design analyzer (601).

When selecting strategic nodes based on the levelization of the design, the level number of the output node of any gate is the maximum of the input node level number plus one. A method to select strategic nodes, in accordance to one or more embodiments of the present invention, operates in accordance with FIG. 10. The maximum number of logic levels (N) to evaluate the logic state of any design node is selected (Step 1000). State nodes are assigned to level zero (Step 1001). Then, level numbers of output nodes of logic gates are assigned to the maximum level of input nodes plus one (Step 1002). For nodes with level numbers equal to multiples of (N), those nodes are designated as strategic nodes (Step 1003). For logic paths that skip node levels that are multiples of (N), the next highest available node is designated as a strategic node (Step 1004). Thereafter, memory locations may be assigned to store the logic states of the strategic nodes (Step 1005).

Figure 11:
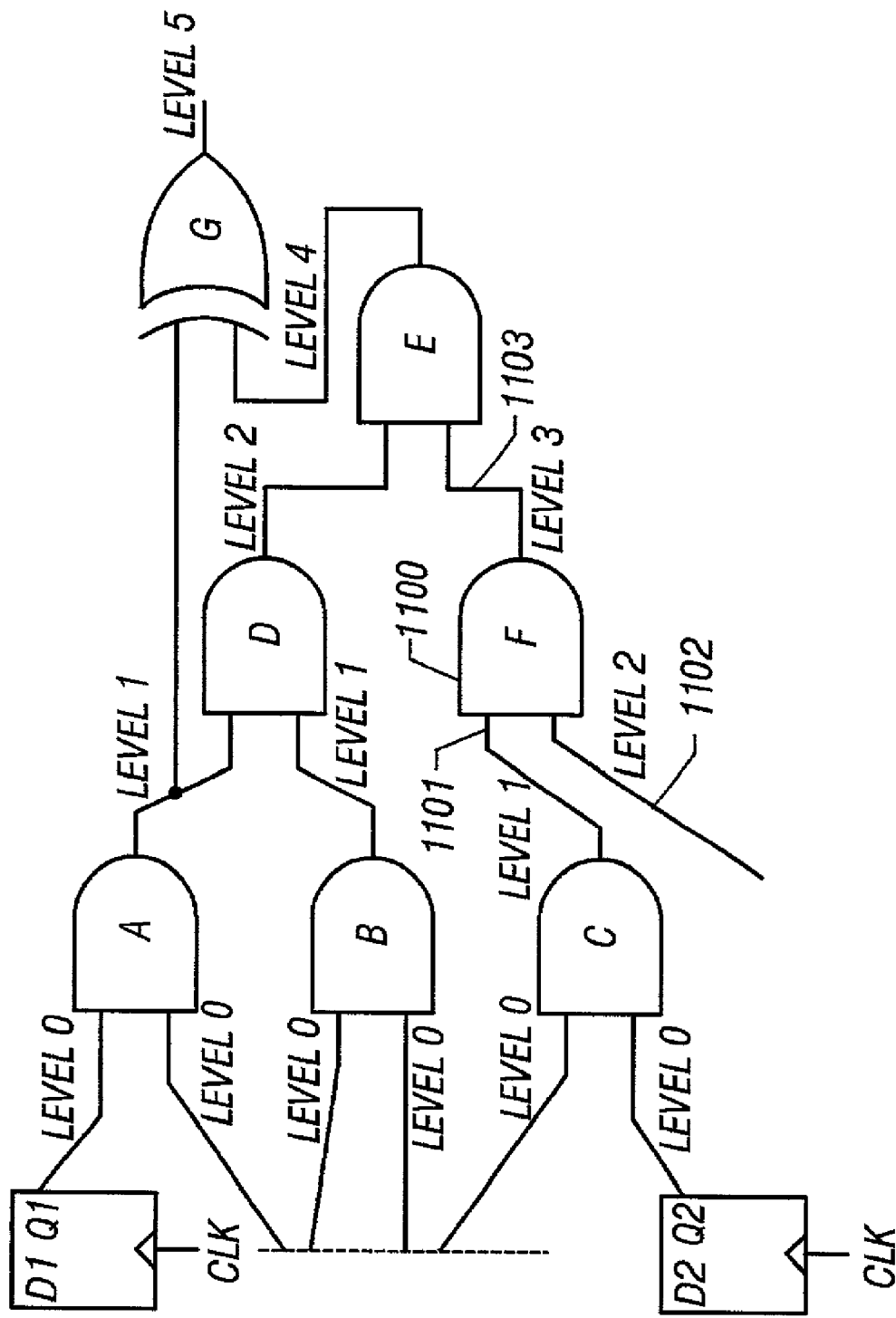
FIG. 11 shows an example of circuit levels and strategic nodes in accordance with an embodiment of the invention.

FIG. 11 provides an example of circuit level numbers and strategic nodes. In the example, by specifying a logic evaluation cost of three, strategic nodes with levels of multiples of three are selected. In FIG. 11, nodes E and F are strategic nodes. A node (1100) has two inputs and one output. Input one (1101) is designated as level one. Input two (1102) is designated as level two. The output (1103) of node F is designated as level three. Thus, the output of any node is the maximum of the largest input to the node plus one, which can be expressed by the following pseudo-code:

```
output level (node_k)
begin
    x = max (input 1, input 2, . . . , input x);
    x = x+1;
end
```

Strategic node (F) is selected as a node of level three. Strategic node (E) is selected because the paths A→D→E and B→D→E miss the node that is level three. Therefore, the next higher level four node (E) is selected.

In one embodiment of the invention, strategic nodes can be selected heuristically as shown in FIG. 12. The compiler provides the user an option to specify the logic evaluation cost (Step 1200). The logic evaluation cost is the maximum number of logic levels to evaluate the logic state of any design node. Then, the compiler levelizes the combinatorial logic gates between the combinatorial logic (Step 1210). The state nodes are marked level 0. The level number of the output node of any gate is the maximum of the input node level number plus one. All the nodes with correct level number are marked as the strategic nodes (Step 1220). For example, if at Step 1200 the user specifies the evaluation cost of 3, the nodes with level 3, 6, 9, 12, etc. (multiples of 3) are marked as strategic nodes. In one embodiment, if the selected level number in a logic path is missing, the node with the next higher level number can be selected as the strategic node. When a design node is marked as a strategic node, the compilation preserves the strategic node (i.e., the design node is not deleted during code generation) (Step 1230). Preserving the strategic node means that the code generation process of the compiler performed by the code generator (605) allocates a specific hardware register or a memory location for the strategic node on the given hardware platform where the present invention is implemented. Therefore, the logic state of the strategic node is always calculated and stored during simulation. Thus, the logic evaluation of any design node can be based on the logic states of state nodes and strategic nodes during simulation.

In one or more embodiments of the invention, the calculation and storage of the logic node is performed using an annotated symbol table. An annotated symbol table (e.g., Phaser Symbol File (PSF)) is a file generated by the compiler that provides information used by runtime support code when a simulation is executed. Though PSF is described as a separate subsystem and file, in an embodiment, the PSF may be integrated with other files produced by the compiler.

The data stored in the PSF may be roughly divided into two categories. The first category is abstract data, which describes the structure of the simulation (i.e., instantiation hierarchy) as described in the source code. The instantiation hierarchy is essentially a list of all registers, wires, variables, and other simulation components. The second category is instance data, which describes the mapping of a particular module and component instantiations onto the physical components (i.e., the target hardware) of the simulation. The instance data includes access information describing how to read or write particular values or portions of values.

When simulating a logic design, a run time call (e.g., "patch environment") allows the user to change the logic design to verify whether or not the fix would work within the simulator without requiring a re-compilation. This functionality is provided by incrementally re-computing the logic state of design nodes associated with a modified portion of the logic design. This re-computation is performed using an updated annotated symbol table and levelized design based on the modifications made to the portion of the logic design.

Figure 10:
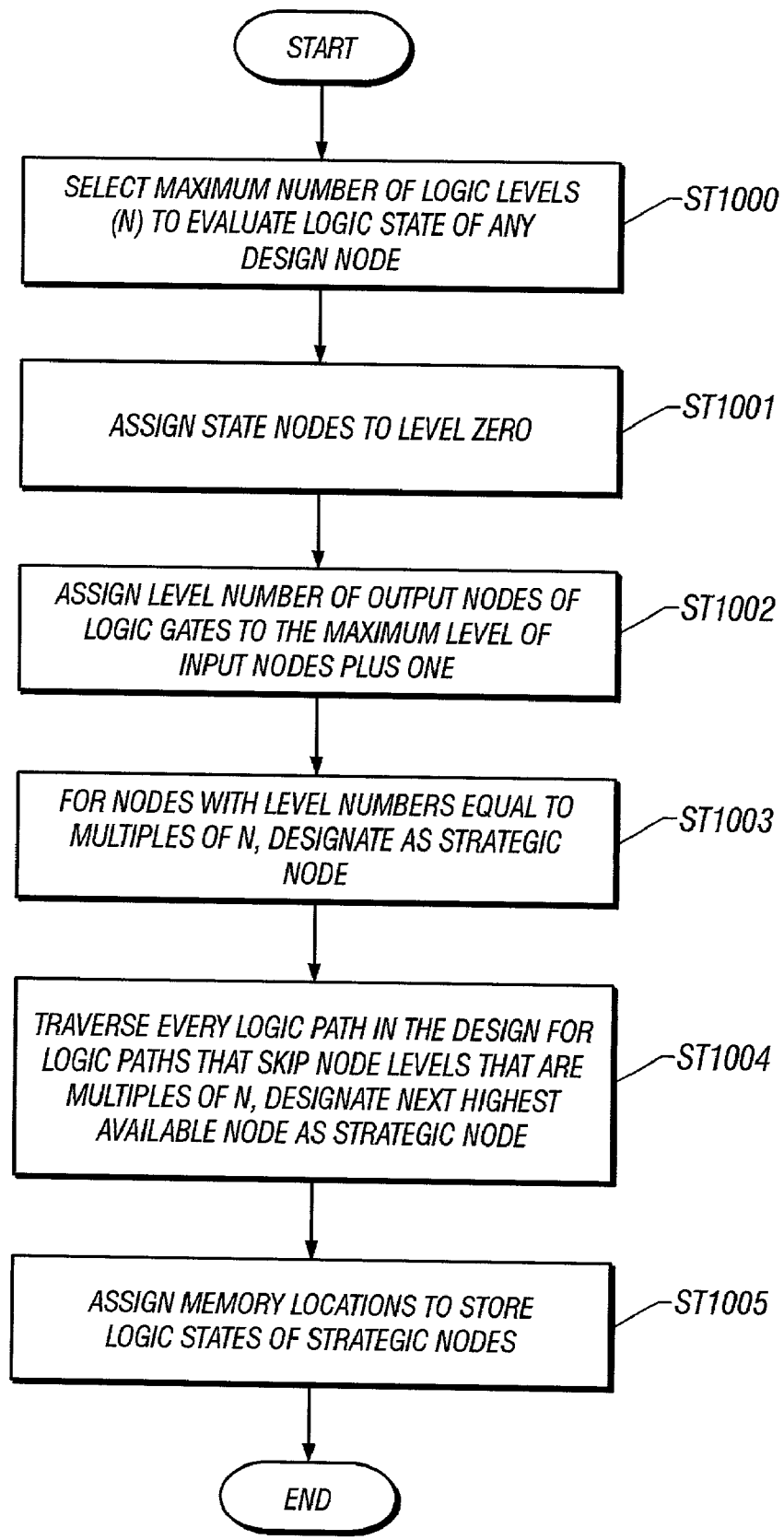
FIG. 10 shows a flow diagram in accordance with an embodiment of the present invention.

When the user wants to probe or trace any design nodes in a logic design, the invention may avoid re-compiling the logic design and still provide good simulation performance by reducing the computation time to evaluate the logic states of the design nodes. A state node or a strategic node is defined as an S-node. Assume evaluation of a logic gate takes one operation. Referring now to FIG. 10, if the logic evaluation of node G is computed only from the value of state nodes, seven operations are required to compute the value of node G. In contrast, with the stored values in the S-nodes, only two operations are required to evaluate gates A and G to compute the logic value of node G, (i.e., computation of A and G using the stored value of the S-node E).

Moreover, the implementation of strategic nodes saves communication time. For instance, assume for this example that the evaluation of node G of FIG. 11 is performed on a separate computer, such as a host computer in a host/simulator arrangement described in FIG. 1. Without strategic nodes, all state nodes in the combinatorial code of G are transferred to the host computer. If strategic nodes are implemented, on the other hand, only some of the S-nodes are transferred to the host computer. For instance, in FIG. 11, only the state nodes which provide input to gate A and S-node E are transferred. Therefore, strategic nodes save both computational cost as well as communication cost.

To evaluate a non-S-node, one embodiment of the present invention evaluates non-S nodes based on a "frontier" of S-nodes. When necessary to compute a non-S node N, a determination is made of the frontier of S-nodes for node N. An S-node X is in the frontier if any path from X to N contains no other S-nodes. Once the S-nodes in the frontier are found, evaluation of N is determined using the stored values of the-S nodes in the frontier.

FIG. 13 shows a flow diagram that describes the evaluation of non-S-nodes. First, given a design node N, the frontier of S-nodes associated with N are determined (Step 1300). The values of S-nodes in the frontier are obtained (Step 1310). Thereafter, the design node is computed using the frontier S-nodes (Step 1320). In FIG. 11, the frontier S-nodes for G node are the input state nodes of gate A and S-node E.

Advantages of the present invention include one or more of the following in one or more embodiments. In one or more embodiments, a design node that may be optimized out during compilation to be accessible (e.g., traced or probed from a host computer) without requiring a re-compilation of the logic design is allowed. Access to a design node using the results of logic levelization is allowed. Providing an ability to perform dynamic re-computation of a logic design modification to evaluate the design modification without re-compilation. Those skilled in the art appreciate that the present invention may include other advantages and features.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for evaluating a logic state of a design node comprising:
   compiling a logic design to generate an annotated symbol table and a levelized design;
   obtaining a logic evaluation cost from the levelized design;
   locating a strategic node using the logic evaluation cost;
   marking the strategic node; and
   computing the logic state of the design node using the annotated symbol table, the strategic node, and the levelized design.

2. The method of claim 1, wherein the annotated symbol table comprises information describing the design node and associated logical dependency.

3. The method of claim 1, wherein the logic evaluation cost is a maximum number of logic levels necessary to evaluate the logic state of the design node.

4. The method of claim 1 further comprising:
   assigning memory locations to store the strategic node.

5. The method of claim 1, wherein computing the logic state of the design node comprises:
   obtaining a logic evaluation cost from the levelized design;
   locating a plurality of state nodes;
   assigning the plurality of state nodes to a first level; and
   assigning a plurality of design nodes to a second level, wherein the second level equals the logic evaluation cost plus a higher value.

6. The method of claim 5, wherein the logic evaluation cost is a maximum number of logic levels necessary to evaluate the logic state of the design node.

7. The method of claim 1, wherein computing the logic state of the design node comprises:
   identifying the design node as a non-strategic node;
   locating a frontier of strategic nodes and state nodes associated with the non-strategic node;
   determining at least one value for the frontier of strategic nodes and state nodes; and
   determining a state for the non-strategic node using the frontier of strategic nodes.

8. The method of claim 7, wherein the frontier of strategic nodes comprises a path between strategic and state nodes with no other strategic nodes.

9. The method of claim 1, further comprising:
   tracing the logic state of the design node without re-compiling the logic design.

10. The method of claim 1, further comprising:
    probing the logic state of the design node without re-compiling the logic design.

11. A method of evaluating a logic state of a design node comprising:
    modifying a portion of a logic design to create a modified logic design;
    updating an annotated symbol table and a levelized design using the modified logic design;
    obtaining a logic evaluation cost from the levelized design;
    locating a strategic node using the logic evaluation cost;
    marking the strategic node; and
    computing a modified logic state of the design node using the annotated symbol table, the strategic node, and the levelized design.

12. The method of claim 11, further comprising:
    verifying the modified logic state of the design node.

13. A computer system for evaluating a logic state of a design node, comprising:
    a processor;
    a memory;
    an input means; and
    software instructions stored in the memory for enabling the computer system under control of the processor, to perform:
        compiling a logic design to generate an annotated symbol table and a levelized design;
        obtaining a logic evaluation cost from the levelized design;
        locating a strategic node using the logic evaluation cost;
        marking the strategic node; and
        computing the logic state of the design node using the annotated symbol table, the strategic node, and the levelized design.

14. The computer system of claim 13, wherein the annotated symbol table comprises the design node and logical dependency.

15. The computer system of claim 13, wherein the logic evaluation cost is a maximum number of logic levels necessary to evaluate the logic state of the design node.

16. The computer system of claim 13, further comprising:
    assigning memory locations to store the strategic node.

17. The computer system of claim 13, wherein computing the logic state of the design node comprises:
  obtaining a logic evaluation cost from the levelized design;
  locating a plurality of state nodes;
  assigning the plurality of state nodes to a first level; and
  assigning a plurality of design nodes to a second level, wherein the second level equals the logic evaluation cost plus a higher value.

18. The computer system of claim 17, wherein the logic evaluation cost is a maximum number of logic levels necessary to evaluate the logic state of the design node.

19. The computer system of claim 13, wherein computing the logic state of the design node comprises:
  identifying the design node as a non-strategic node;
  locating a frontier of strategic nodes and state nodes associated with the non-strategic node;
  determining at least one value for the frontier of strategic nodes and state nodes; and
  determining a state for the non-strategic node using the frontier of strategic nodes.

20. The computer system of claim 19, wherein the frontier of strategic nodes comprises a path between strategic and state nodes with no other strategic nodes.

21. A computer system to evaluate a logic state of a design node, comprising:
  a processor;
  a memory;
  an input means;
  a display device; and
  software instructions stored in the memory for enabling the computer system under control of the processor, to perform:
    modifying a portion of a logic design creating a modified logic design;
    updating an annotated symbol table and a levelized design using the modified logic design;
    obtaining a logic evaluation cost from the levelized design;
    locating a strategic node using the logic evaluation cost;
    marking the strategic node;
    computing a modified logic state of the design node using the annotated symbol table, the strategic node, and the levelized design; and
    verifying the modified logic state of the design node.

22. An apparatus for evaluating a logic state of a design node comprising: means for compiling a logic design to generate an annotated symbol table and a levelized design;
  means for obtaining a logic evaluation cost from the levelized design;
  means for locating a strategic node using the logic evaluation cost;
  means for marking the strategic node; and
  means for computing the logic state of the design node using the annotated symbol tables the strategic node, and the levelized design.

23. An apparatus for evaluating a logic state of a design node comprising:
  means for modifying a portion of a logic design creating a modified logic design;
  means for updating an annotated symbol table and a levelized design using the modified logic design;
  means for obtaining a logic evaluation cost from the levelized design;
  means for locating a strategic node using the logic evaluation cost;
  means for marking the strategic node;
  means for computing a modified logic state of the design node using the annotated symbol table, the strategic node, and the levelized design; and
  means for verifying the modified logic state of the design node.

* * * * *